US008883598B2

(12) United States Patent
Chu et al.

(10) Patent No.: US 8,883,598 B2
(45) Date of Patent: Nov. 11, 2014

(54) THIN CAPPED CHANNEL LAYERS OF SEMICONDUCTOR DEVICES AND METHODS OF FORMING THE SAME

(75) Inventors: Che-Ting Chu, Hsinchu (TW); Shih-Hsun Chang, Hsinchu (TW); Pang-Yen Tsai, Jhu-bei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 13/412,099

(22) Filed: Mar. 5, 2012

(65) Prior Publication Data

US 2013/0230977 A1 Sep. 5, 2013

(51) Int. Cl.
*H01L 21/8232* (2006.01)
*H01L 21/20* (2006.01)
*H01L 29/66* (2006.01)
*H01L 29/10* (2006.01)

(52) U.S. Cl.
CPC ...... *H01L 29/1054* (2013.01); *H01L 29/66651* (2013.01)
USPC .... 438/285; 438/492; 438/507; 257/E29.299; 257/E21.618

(58) Field of Classification Search
CPC ............ H01L 29/1033; H01L 29/1054; H01L 29/66651
USPC .......................... 438/154, 164, 492, 507, 285; 257/E21.618, E21.633, E29.299
See application file for complete search history.

(56) References Cited

U.S. PATENT DOCUMENTS

| | | | | |
|---|---|---|---|---|
| 5,212,110 A * | 5/1993 | Pfiester et al. | ................ | 438/222 |
| 6,008,077 A * | 12/1999 | Maeda | .......... | 438/151 |
| 6,054,719 A * | 4/2000 | Fusser et al. | .................... | 257/14 |
| 6,059,895 A * | 5/2000 | Chu et al. | ..................... | 148/33.1 |
| 6,339,232 B1 * | 1/2002 | Takagi | .......................... | 257/192 |
| 6,369,438 B1 * | 4/2002 | Sugiyama et al. | ............ | 257/616 |
| 6,492,216 B1 * | 12/2002 | Yeo et al. | ...................... | 438/197 |
| 6,512,252 B1 * | 1/2003 | Takagi et al. | ................. | 257/192 |
| 6,621,114 B1 * | 9/2003 | Kim et al. | ..................... | 257/310 |
| 6,690,043 B1 * | 2/2004 | Usuda et al. | .................... | 257/194 |
| 6,924,181 B2 * | 8/2005 | Huang et al. | .................. | 438/197 |
| 7,022,593 B2 * | 4/2006 | Arena et al. | .................. | 438/494 |
| 7,060,632 B2 * | 6/2006 | Fitzgerald et al. | ........... | 438/767 |
| 7,109,099 B2 * | 9/2006 | Tan et al. | ...................... | 438/527 |
| 7,148,130 B2 * | 12/2006 | Miyano | ........................ | 438/509 |
| 7,198,997 B2 * | 4/2007 | Shiono et al. | ................. | 438/197 |
| 7,282,402 B2 * | 10/2007 | Sadaka et al. | ................. | 438/221 |
| 7,348,259 B2 * | 3/2008 | Cheng et al. | .................. | 438/458 |
| 7,524,740 B1 * | 4/2009 | Liu et al. | ........................ | 438/479 |
| 7,741,167 B2 * | 6/2010 | Beyer et al. | ................... | 438/199 |
| 8,030,148 B2 * | 10/2011 | Hoentschel et al. | .......... | 438/198 |
| 8,048,791 B2 * | 11/2011 | Hargrove et al. | ............. | 438/591 |
| 8,110,486 B2 * | 2/2012 | Matsumoto et al. | .......... | 438/509 |
| 8,232,186 B2 * | 7/2012 | Harley et al. | ................. | 438/507 |
| 8,293,596 B2 * | 10/2012 | Kronholz et al. | ............. | 438/199 |
| 8,324,119 B2 * | 12/2012 | Reichel et al. | ................ | 438/791 |

(Continued)

*Primary Examiner* — Mary Wilczewski
(74) *Attorney, Agent, or Firm* — Duane Morris LLP

(57) ABSTRACT

Semiconductor devices and methods of forming the same. The method includes providing a semiconductor substrate having a channel layer over the substrate. A capping layer including silicon and having a first thickness is formed over the channel layer. The capping layer is partially oxidized to form an oxidized portion of the capping layer. The oxidized portion of the capping layer is removed to form a thinned capping layer having a second thickness less than the first thickness.

20 Claims, 5 Drawing Sheets

(56) References Cited

U.S. PATENT DOCUMENTS

| | | | |
|---|---|---|---|
| 8,357,604 B2* | 1/2013 | Hoentschel et al. | 438/592 |
| 2002/0011617 A1* | 1/2002 | Kubo et al. | 257/301 |
| 2003/0013305 A1* | 1/2003 | Sugii et al. | 438/689 |
| 2004/0195623 A1* | 10/2004 | Ge et al. | 257/347 |
| 2005/0221591 A1* | 10/2005 | Bedell et al. | 438/479 |
| 2007/0090467 A1* | 4/2007 | Zhu | 257/390 |
| 2007/0128840 A1* | 6/2007 | Chen et al. | 438/493 |
| 2008/0149988 A1* | 6/2008 | Kinoshita et al. | 257/315 |
| 2010/0187635 A1* | 7/2010 | Beyer et al. | 257/369 |
| 2010/0213553 A1* | 8/2010 | Hargrove et al. | 257/410 |
| 2010/0221883 A1* | 9/2010 | Kronholz et al. | 438/285 |
| 2010/0289094 A1* | 11/2010 | Reichel et al. | 257/409 |
| 2011/0278646 A1 | 11/2011 | Ng et al. | |
| 2012/0108039 A1* | 5/2012 | Zojaji et al. | 438/492 |
| 2012/0156864 A1* | 6/2012 | Kronholz et al. | 438/492 |
| 2012/0282763 A1* | 11/2012 | Kronholz et al. | 438/492 |

\* cited by examiner

THIN CAPPED CHANNEL LAYERS OF SEMICONDUCTOR DEVICES AND METHODS OF FORMING THE SAME

FIELD

The present disclosure is directed generally to semiconductor devices and more particularly to methods of forming such devices.

DESCRIPTION OF THE RELATED ART

Epitaxial growth of silicon germanium (SiGe) channel layers on silicon (Si) semiconductor substrates has been demonstrated to be of significant technological interest for fabricating semiconductor devices. For example, the combined effects of strain and alloying are conventionally known to enhance hole mobility and permit desired work function level adjustment in p-type metal-oxide-semiconductor-field-effect-transistors (p-MOSFETs). Deposition of thin Si capping layers over the SiGe channel layers has been shown to achieve close to band edge work functions at certain thicknesses. However, formation of the thin Si capping layer using conventional deposition processes induces surface undulation, nonuniformities and roughness in the capping layer which is harmful to the reliability and performance of the semiconductor device.

BRIEF DESCRIPTION OF THE DRAWINGS

Various aspects of the present disclosure will be or become apparent to one with skill in the art by reference to the following detailed description when considered in connection with the accompanying exemplary non-limiting embodiments.

DETAILED DESCRIPTION OF THE EXAMPLES

Figure 1:
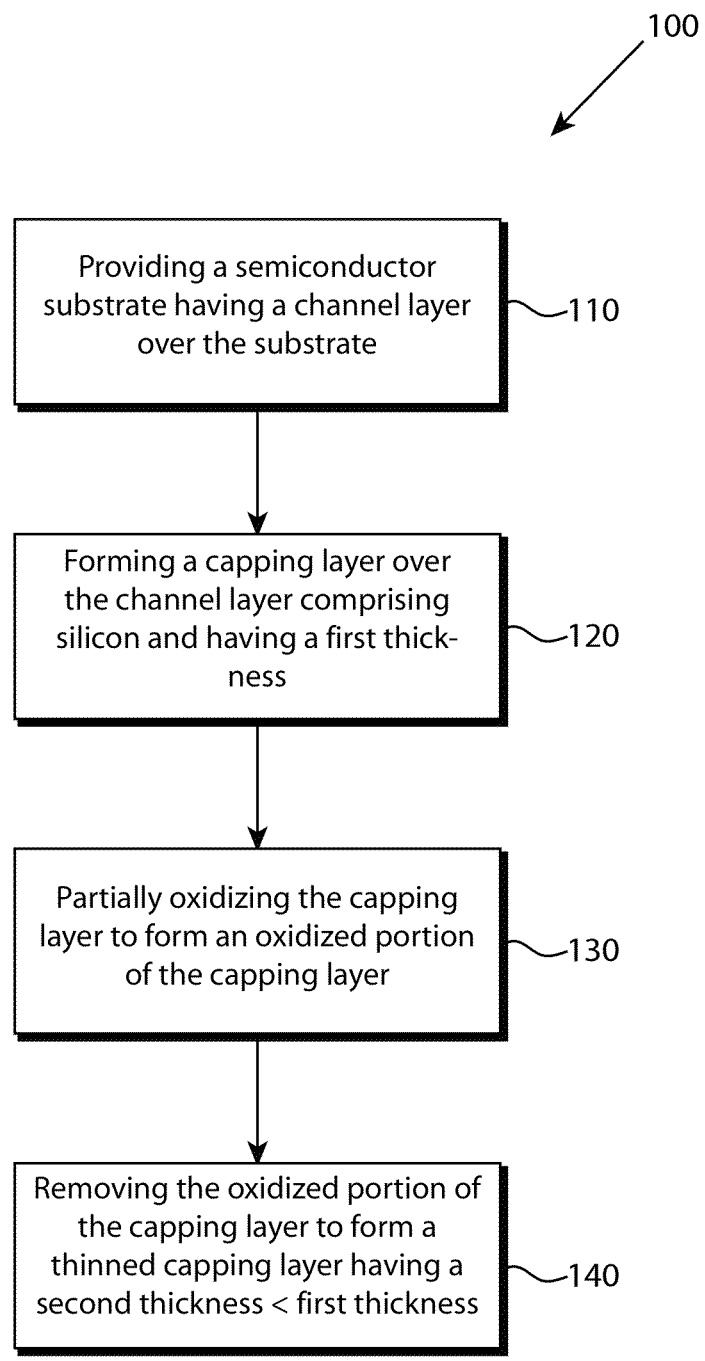
FIG. 1 is a flow chart illustrating a method of forming a semiconductor device according to embodiments of the present disclosure.

With reference to the Figures, where like elements have been given like numerical designations to facilitate an understanding of the drawings, the various embodiments of a multi-gate semiconductor device and methods of forming the same are described. The figures are not drawn to scale.

The following description is provided as an enabling teaching of a representative set of examples. Many changes can be made to the embodiments described herein while still obtaining beneficial results. Some of the desired benefits discussed below can be obtained by selecting some of the features or steps discussed herein without utilizing other features or steps. Accordingly, many modifications and adaptations, as well as subsets of the features and steps described herein are possible and may even be desirable in certain circumstances. Thus, the following description is provided as illustrative and is not limiting.

This description of illustrative embodiments is intended to be read in connection with the accompanying drawings, which are to be considered part of the entire written description. In the description of embodiments disclosed herein, any reference to direction or orientation is merely intended for convenience of description and is not intended in any way to limit the scope of the present invention. Relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description only and do not require that the apparatus be constructed or operated in a particular orientation. Terms such as "attached," "affixed," "connected" and "interconnected," refer to a relationship wherein structures are secured or attached to one another either directly or indirectly through intervening structures, as well as both movable or rigid attachments or relationships, unless expressly described otherwise. The term "adjacent" as used herein to describe the relationship between structures/components includes both direct contact between the respective structures/components referenced and the presence of other intervening structures/components between respective structures/components.

As used herein, use of a singular article such as "a," "an" and "the" is not intended to exclude pluralities of the article's object unless the context clearly and unambiguously dictates otherwise.

Improved semiconductor devices and methods of forming the same are provided. The inventors have observed that for very thin Si capping layers (approximately 0 nm) band edge work functions may be achieved. However, the inventors have also determined that a tradeoff in formation of these very thin Si capping layers is the generation of a higher interface trap density ($D_{IT}$) that results in reduced device performance. Formation of a thicker Si capping layer was observed to improve inversion oxide thickness ($T_{ox,inv}$) increment yet resulted in less band edge work function, poor junction leakage for band-to band tunneling (BTBT) and a less confined leakage profile resulting in reduced device performance and reliability.

The inventors observed that thin Si capping layers (approximately 3 nm or less) provide band edge work functions, improved short channel effect (SCE) and less band-to band tunneling. Although higher inversion oxide thickness ($T_{ox,inv}$) increment was also observed in Si capping layers of this thickness, this consequence is offset by the determined benefits. However, formation of a Si capping layer of this optimum thickness using some deposition processes such as, e.g. chemical vapor deposition (CVD)) caused surface undulation and nonuniformities in the Si capping layer. Surface undulation is harmful to device performance and reliability.

The inventors observed that deposition time in the process chamber directly correlated to both layer thickness and surface undulation effects. For example, the inventors observed that surface undulation and discontinuity is higher when the Si capping layer is deposited at a thickness of approximately 6 nm or less or the SiGe channel layer is deposited at a thickness of less than 10 nm. The inventors have developed methods of forming semiconductor devices that permit realization of the benefits of thin, uniform Si capping layers and minimize the harmful effects of surface undulation. Thus, improved semiconductor device performance and reliability is achieved.

FIG. 1 is a flow chart illustrating a method 100 of forming a semiconductor device according to some embodiments. At block 110, a semiconductor substrate having a channel layer over the substrate is provided. The semiconductor substrate may be a bulk silicon substrate, a bulk silicon germanium (SiGe) substrate, a Group III-V compound substrate, or a substrate formed of other suitable materials. Substrate 102 may be doped with a p-type or an n-type impurity. The substrate may also include a compound semiconductor such as, for example, silicon carbide, gallium arsenic, indium arsenide or indium phosphide. In some embodiments, the substrate is not pre-processed prior to being provided in a process chamber. In some embodiments, the substrate may undergo pre-clean process steps in situ to remove material from at least a portion of the semiconductor substrate. For example, substrate 102 may be patterned and etched through a photolithographic process. Etching of the substrate may include, but is not limited to, a wet etch (e.g. anisotropic wet etch using etchant HCl) or a dry etch (e.g. plasma etch using etchant $Cl_2$). In another embodiment, the substrate may undergo pre-clean process steps prior to being provided in a process chamber including, but not limited to, etching, oxygen ($O_2$) strip, RCA clean, combinations thereof, etc. In some embodiments, one or more shallow trench isolation (STI) regions may be formed adjacent to the substrate The channel layer may be formed from any suitable material including, but not limited to Ge, SiGe or a III-V semiconductor material. The channel layer may be an epitaxial layer. The channel layer may be formed over the substrate by any suitable method. For example, the channel layer may be deposited using a thermal CVD process. In some embodiments, dopants may be introduced into the channel layer by any suitable method. For example, channel layer dopants may be introduced through in-situ doping. In some embodiments, one or more intervening layers are provided between the bulk substrate and the channel layer. The thickness of the channel layer may be dependent on the function of the semiconductor device. The inventors have observed surface undulation and discontinuities in channel layers including SiGe of less than approximately 10 nm. In some embodiments, the channel layer is formed over the substrate after the substrate undergoes pre-process steps to remove material from at least a portion of the substrate. In some embodiments, the channel layer may undergo pre-clean process steps in-situ prior to deposition of any additional layers. For example, channel layer may be etched through a wet etch (e.g. anisotropic wet etch using an etchant such as HCl) or a dry etch (e.g. plasma etch using an etchant such as $Cl_2$ plasma). In some embodiments, the channel region may be formed adjacent to, or between, one or more STI regions.

At block 120, a capping layer including silicon and having a first thickness may be formed over the channel layer. The capping layer may be formed over the substrate by any suitable method. For example, the channel layer may be deposited using a thermal CVD process. The inventors have observed that by depositing a thicker capping layer over the channel layer, surface undulation and nonuniformities in the capping layer may be minimized. Here the term "thicker" is relative to the final thickness of the capping layer at the completion of subsequent processing. In some embodiments, the first thickness is approximately 5 nm (e.g. between 4.9 and 5.1 nm) or more. In other embodiments, the first thickness is approximately 7 nm (e.g. between 6.9 and 7.1 nm) or more. The first thickness may be dependent on the quality of the deposition process. In some embodiments, the surface undulation level of the thicker capping layer is approximately 75% or less. (e.g., 70%). The surface undulation level may be defined as 3-sigma over a median of values of thickness of the capping layer across the substrate and may be determined by any suitable method including, but not limited to, transmission electron microscopy (TEM), atomic force microscopy (AFM), etc. The thickness of the first thickness may also be dependent upon cost or other parameters.

At block 130, the capping layer is partially oxidized to form a partially oxidized portion of the capping layer. In some embodiments, the capping layer may be partially oxidized to form $SiO_2$. The capping layer may be partially oxidized by any suitable method. In some embodiments, the capping layer may be partially oxidized by reacting with oxygen from the atmosphere surrounding the semiconductor device to form the oxidized portion of the capping layer. In some embodiments, a Si capping layer may be partially oxidized using a thermal oxidation method to form an $SiO_2$ portion of a Si capping layer. For example, partial oxidation of a Si capping layer may be performed using water vapor and/or molecular oxygen as oxidants. By way of example, partial oxidation of a Si capping layer of approximately 5 nm may be performed in a process chamber at a temperature between approximately 800 and 1100 degrees Celsius, a time between approximately 10-200 seconds, $H_2/O_2$ between approximately 0-50%, and a pressure between approximately 1 and 100 Torr, to partially oxidize approximately 2 nm of the Si capping layer. The oxidation process may be controlled by following the Deal-Grove model to determine the eventual thickness of the thinned Si capping layer.

At block 140, the oxidized portion of the capping layer is removed to form a thinned capping layer having a second thickness less than the first thickness. In preferred embodiments, the oxidized portion of the capping layer is removed using a wet etch process. For example, a buffered oxide etch (e.g. buffered or dilute hydrofluoric acid (HF) or BHF etch) process may be used to remove the oxidized portion (e.g. $SiO_2$ portion) of the capping layer. The inventors have observed that the oxidation and wet etch processes are stable, uniform processes relative to CVD processes. The inventors have discovered that by depositing a thicker capping layer substantially free of surface undulations, partially oxidizing the thicker capping layer, and then removing the oxidized portion of the capping layer, a thinned capping layer of a second thickness with minimized surface undulation and nonuniformities can be achieved. The second thickness may be a thickness that achieves band edge work functions, improved short channel effect and less band-to band tunneling, but also has improved device performance and reliability. In some embodiments, the second thickness may be approximately 3 nm (between 3.1 and 2.9 nm) or less. In some embodiments, the second thickness is between approximately 0 and 1 nm (e.g. 0.05 to 1.05 nm).

Figure 2:
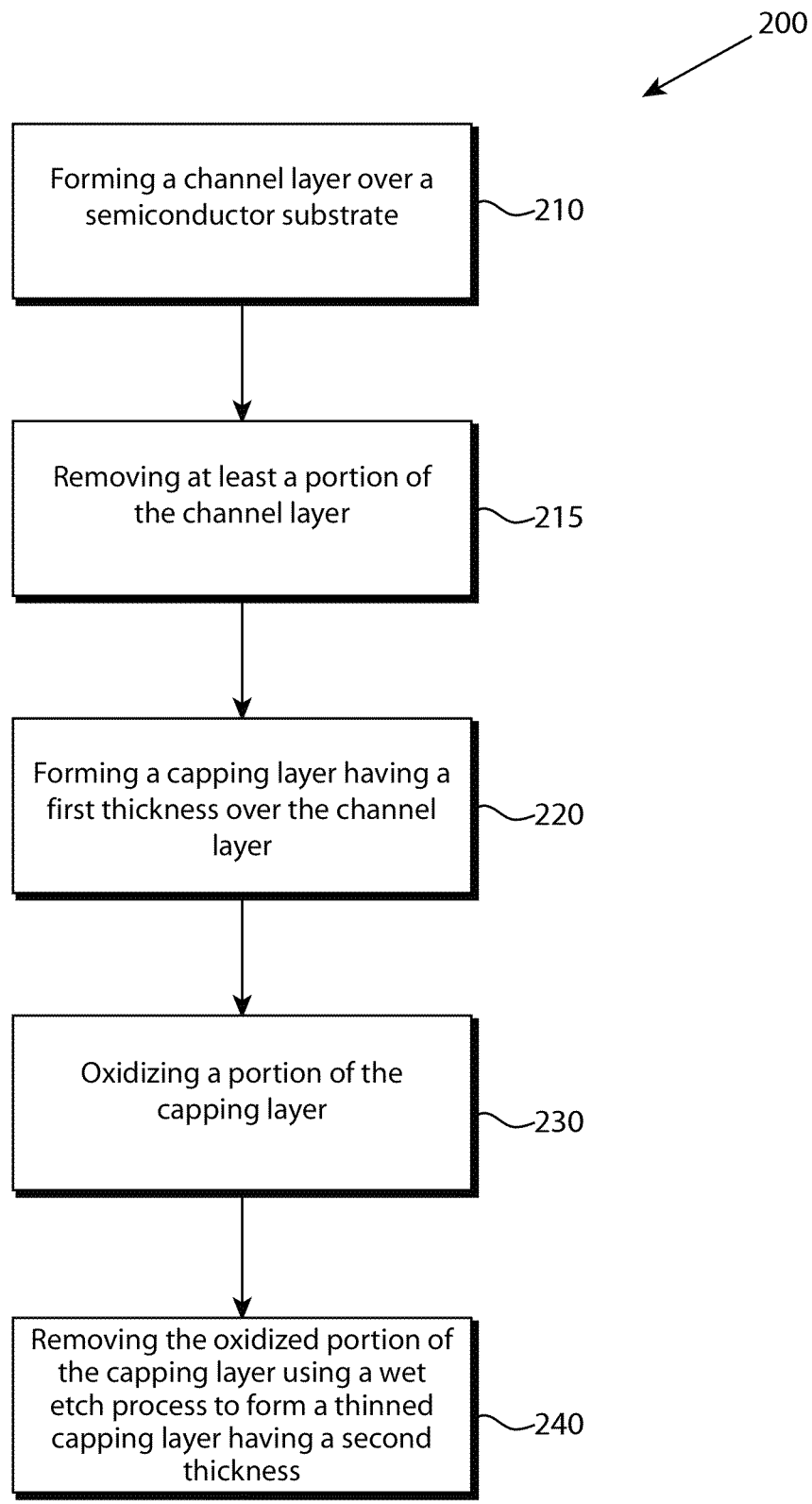
FIG. 2 is a flow chart illustrating a method of forming a semiconductor device according to embodiments of the present disclosure.

FIG. 2 shows a flow chart of a method 200 of forming a semiconductor device according to some embodiments. At block 210, a channel layer is formed over a semiconductor substrate. The substrate may be formed of any suitable semiconductor material. The channel layer may be formed as described above for FIG. 1. In one embodiment, the channel layer includes silicon germanium (SiGe). At block 215, at least a portion of the channel layer is removed. In some embodiments, at least a portion of the channel layer may be removed by an in-situ etching process. For example, channel layer may be etched through a wet etch (e.g. isotropic wet etch using an etchant HCl) or a dry etch (e.g. plasma etch using an etchant $Cl_2$). At block 220, a capping layer having a first thickness is formed over the channel layer as described above for FIG. 1. In some embodiments, the capping layer includes Si. The first thickness is formed over the channel layer as described above to achieve a capping layer substantially free of surface undulation and nonuniformities. In some embodiments, the first thickness is approximately 5 nm (e.g. between 4.9 and 5.1 nm) or more. In other embodiments, the first thickness is approximately 7 nm (e.g. between 6.9 and 7.1 nm) or more. At block 230, a portion of the capping layer is oxidized as described above for block 130. At block 240, the oxidized portion of the capping layer is removed using a wet etch process (e.g. process using dilute HF etchant) to form a thinned capping layer having a second thickness less than the first thickness as described above for FIG. 1. The thinned capping layer is substantially free of surface undulations and nonuniformities and optimum capping layer parameters (e.g. band edge WF, SCE and less BTBT).

Figure 3:
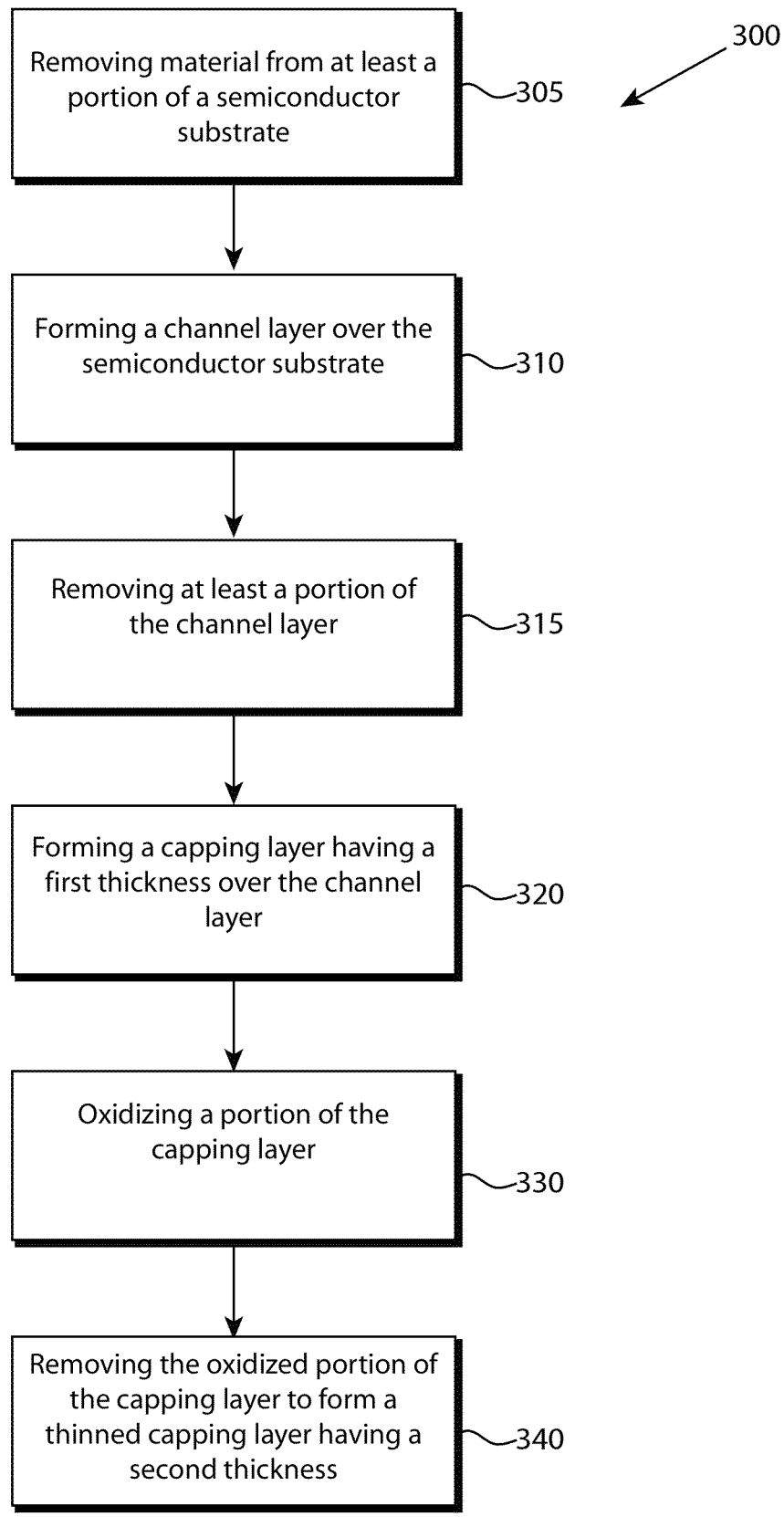
FIG. 3 is a flow chart illustrating a method of forming a semiconductor device according to some embodiments.

With reference now to FIG. 3, a flow chart illustrating a method of forming a semiconductor device is shown. At block 305, material from at least a portion of a semiconductor substrate is removed. For example, the substrate may be patterned and etched in situ through a photolithographic process. Removal of material from the substrate may include, but is not limited to, an etching process (e.g. wet etch or dry etch). At block 310, a channel layer is formed over the semiconductor substrate after removing the material. Blocks 315 to 340 illustrate a method of forming a semiconductor device that is substantially similar to that described above for blocks 215 to 240 of FIG. 2, and descriptions of these steps are not repeated.

Figure 4A:
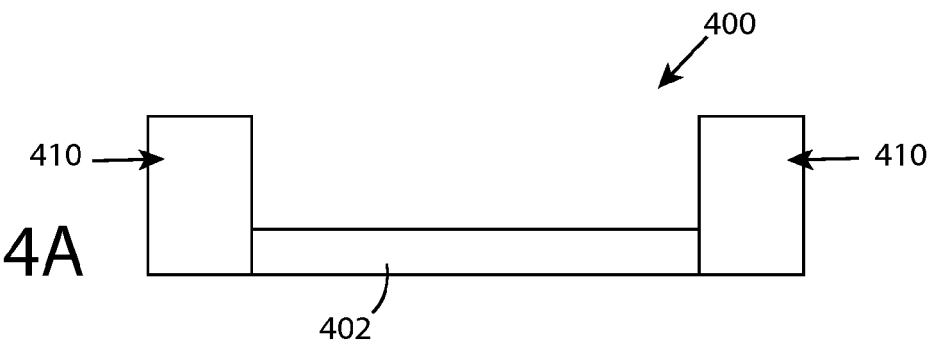
FIGS. 4A-4E show cross-sectional views of a semiconductor device structure and method for forming the same, according to embodiments of the present disclosure.

FIGS. 4A-4E show cross-sectional views of a semiconductor device structure and method for forming the same according to some embodiments. In FIG. 4A, the semiconductor device 100 includes a semiconductor substrate 402. Semiconductor substrate 402 may be a bulk silicon substrate, a bulk silicon germanium (SiGe) substrate, a Group III-V compound substrate, or a substrate formed of other suitable materials. Substrate 402 may be doped with a p-type or an n-type impurity. One or more isolation regions, such as shallow trench isolation (STI) regions (410) may be formed in or over substrate 402. Substrate 402 may be patterned and etched, e.g. through a photolithographic process, to a level lower than the original top surface of substrate (not shown).

Figure 4B:
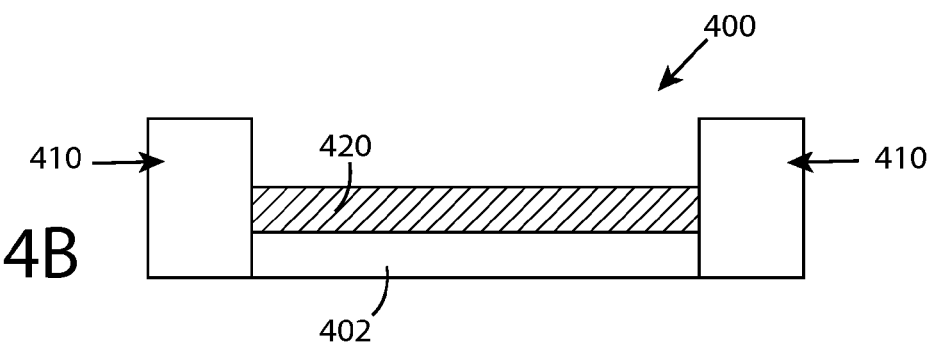
Figure 4C:
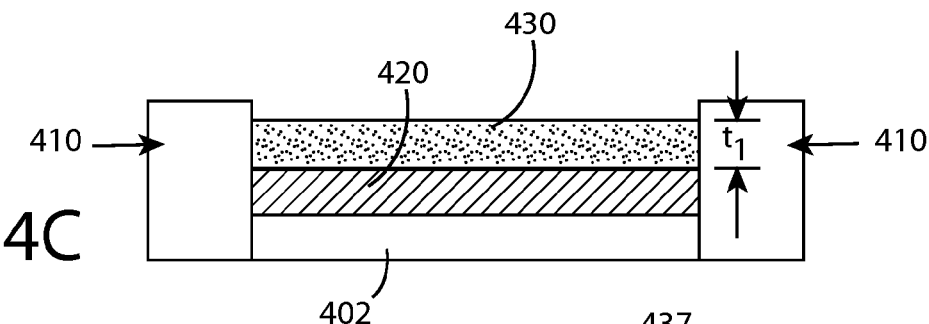

With reference now to FIG. 4B, a channel layer 420 is shown formed over semiconductor substrate 402. The channel layer 420 may be formed from any suitable material including, but not limited to Ge, SiGe or a III-V semiconductor material. In preferred embodiments, the channel layer 420 is formed from a material including SiGe over a Si substrate. In some embodiments, one or more intervening layers may be provided between substrate 402 and channel layer 420. In FIG. 4C, a thicker capping layer 430 having a first thickness $t_1$ is formed over channel layer 420. As shown, thicker capping layer 430 is substantially free of surface undulations and nonuniformities. In some embodiments, the first thickness $t_1$ is approximately 5 nm or more. In other embodiments, the first thickness $t_1$ is approximately 7 nm or more.

Figure 4D:
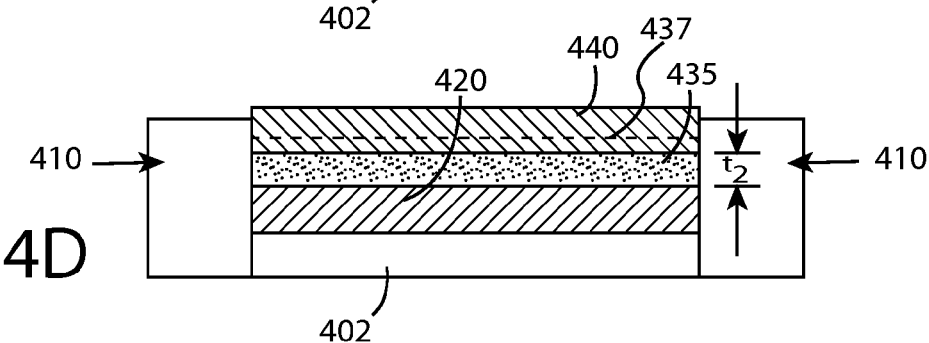
Figure 4E:
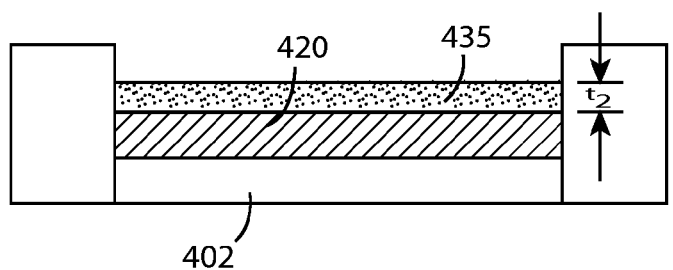

With reference now to Figure 4D, an oxidation layer 440 is formed including an oxidized portion 437 of the thicker capping layer 430. In some embodiments, a portion 437 of a Si capping layer 430 is oxidized to form an $SiO_2$ portion 437 of the Si capping layer 430. In FIG. 4E, oxidation layer 440 including the oxidized portion 437 of the thicker capping layer 430 is removed. The thinned capping layer 435 remains having a second thickness $t_2$. As shown, thinned capping layer 435 is also substantially free of surface undulations and non-uniformities.

Figure 5:
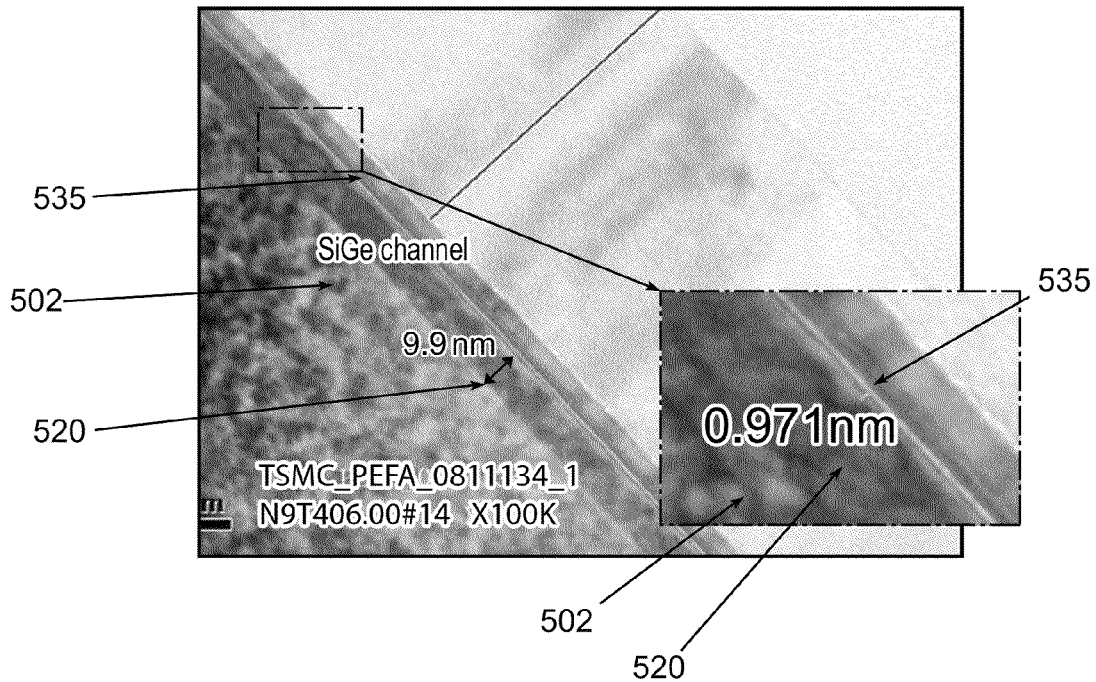
FIG. 5 shows a cross-sectional view and an enlarged view of an example of a semiconductor device according to embodiments of the present disclosure.

FIG. 5 shows a cross-sectional view and enlarged view of an example of a semiconductor device according to embodiments of the present disclosure. A 9.9 nm channel layer 520 of 30% SiGe was formed over an Si semiconductor substrate according to embodiments of the present disclosure. A 0.971 nm Si thinned capping layer 535 was formed over the channel layer according to some embodiments. As shown the thinned Si capping layer 535 is substantially free of surface undulations.

One embodiment provides a method of forming a semiconductor device including providing a semiconductor substrate having a channel layer over the substrate. A capping layer including silicon and having a first thickness is formed over the channel layer. The capping layer is partially oxidized to form an oxidized portion of the capping layer. The oxidized portion of the capping layer is removed to form a thinned capping layer having a second thickness less than the first thickness.

Another embodiment provides a method of forming a semiconductor device including forming a channel layer over a semiconductor substrate. At least a portion of the channel layer is removed. A capping layer having a first thickness is formed over the channel layer. A portion of the capping layer is oxidized and the oxidized portion of the capping layer is removed using a wet etch process to form a thinned capping layer having a second thickness.

A further embodiment provides a method of forming a semiconductor device, including removing material from at least a portion of a semiconductor substrate. A channel layer is formed over the semiconductor substrate. At least a portion of the channel layer is removed. A capping layer having a first thickness is formed over the channel layer. A portion of the capping layer is oxidized and the oxidized portion of the capping layer is removed using an etch process to form a thinned capping layer having a second thickness.

While various embodiments have been described, it is to be understood that the embodiments described are illustrative only and that the scope of the subject matter is to be accorded a full range of equivalents, many variations and modifications naturally occurring to those of skill in the art from a perusal hereof.

What we claim is:

1. A method of forming a semiconductor device, comprising:
    providing a semiconductor substrate having a channel layer comprising a semiconductor alloy over the substrate;
    forming a non-alloy capping layer over the channel layer comprising silicon and having a first thickness and a first surface undulation level;
    partially oxidizing the capping layer to form an oxidized portion of the capping layer; and
    removing the oxidized portion of the capping layer to form a thinned capping layer having a second thickness less than the first thickness and a second surface undulation level less than the first surface undulation level.

2. The method of claim 1, wherein the channel layer comprises silicon germanium.

3. The method of claim 2, wherein the first thickness is approximately 5 nm or greater and the second thickness is approximately 3 nm or less.

4. The method of claim 1, further comprising:
    removing material from at least a portion of the semiconductor substrate; and
    forming the channel layer over the substrate after removing the material.

5. The method of claim 4, wherein the removing step includes a wet or dry etching step.

6. The method of claim 1, further comprising:
removing at least a portion of the channel layer.

7. The method of claim 6, wherein the removing step includes a wet or dry etching step.

8. The method of claim 1, wherein the partially oxidizing step further comprises purging oxygen from the atmosphere surrounding the semiconductor device to form the oxidized portion of the capping layer.

9. The method of claim 8, wherein the oxidized portion comprises SiO2.

10. The method of claim 1, wherein the removing the oxidized portion of the capping layer step further comprises a wet etch process.

11. The method of claim 1, wherein the first surface undulation level is less than approximately 75%.

12. The method of claim 1, wherein the second thickness is greater than 0 and up to 1 nm.

13. The method of claim 1, wherein the channel layer is formed between shallow trench isolation regions.

14. A method of forming a semiconductor device, comprising:
forming a channel layer comprising a semiconductor alloy over a semiconductor substrate;
removing at least a portion of the channel layer;
forming an elemental capping layer comprising silicon and having a first thickness and a first surface undulation level over the channel layer;
oxidizing a portion of the capping layer; and
removing the oxidized portion of the capping layer using a wet etch process to form a thinned capping layer having a second thickness and a second surface undulation level less than the first surface undulation level.

15. The method of claim 14, wherein the second thickness is greater than 0 and up to 3 nm.

16. The method of claim 14, wherein the channel layer comprises silicon germanium.

17. The method of claim 14, wherein the removing at least a portion of the channel layer step includes a wet or dry etching step.

18. The method of claim 14, wherein the capping layer is formed to improve work function toward a band edge of the channel layer.

19. A method of forming a semiconductor device, comprising:
removing material from at least a portion of a semiconductor substrate;
forming a semiconductor alloy channel layer over the semiconductor substrate;
removing at least a portion of the channel layer;
forming a silicon capping layer having a first thickness and a first surface undulation level over the channel layer, the silicon capping layer being formed to improve work function toward a band edge of the channel layer;
oxidizing a portion of the silicon capping layer; and
removing the oxidized portion of the silicon capping layer using an etch process to form a thinned silicon capping layer having a second thickness and a second surface undulation level less than the first surface undulation level.

20. The method of claim 19, wherein the second thickness is greater than 0 and up to 3 nm.

* * * * *